(12) United States Patent
Hobmeyr et al.

(10) Patent No.: US 7,176,385 B2
(45) Date of Patent: Feb. 13, 2007

(54) EMI PROTECTION AND FUEL CELL SYSTEMS EMPLOYING THE SAME

(75) Inventors: Ralph Hobmeyr, Mainz-Kastel (DE); Jeff Shull, Arvada, CO (US); Titus Herschberger, Littleton, CO (US); Hartmut Hinz, Kronberg (DE); Steve Rysdam, Fort Lupton, CO (US)

(73) Assignee: General Motors Corporation, Detroit, MI (US)

( * ) Notice: Subject to any disclaimer, the term of this patent is extended or adjusted under 35 U.S.C. 154(b) by 512 days.

(21) Appl. No.: 10/702,087

(22) Filed: Nov. 5, 2003

(65) Prior Publication Data

US 2005/0092534 A1    May 5, 2005

(51) Int. Cl.
*H05K 9/00* (2006.01)

(52) U.S. Cl. .............. 174/382; 174/387; 174/377; 361/816; 180/65.3

(58) Field of Classification Search ............ 174/377, 174/384, 387, 382; 361/818, 800, 816; 180/65.3
See application file for complete search history.

(56) References Cited

U.S. PATENT DOCUMENTS

| | | | | |
|---|---|---|---|---|
| 4,754,101 | A * | 6/1988 | Stickney et al. ............ | 174/383 |
| 5,166,584 | A * | 11/1992 | Fukino et al. ............... | 318/139 |
| 5,294,994 | A | 3/1994 | Robinson et al. ........... | 348/825 |
| 5,550,713 | A | 8/1996 | Pressler et al. | |
| 6,178,097 | B1 * | 1/2001 | Hauk, Jr. .................... | 361/816 |
| 6,274,808 | B1 * | 8/2001 | Cercioglu et al. .......... | 174/371 |
| 6,320,762 | B1 * | 11/2001 | Chen et al. ................. | 361/818 |
| 6,385,054 | B1 * | 5/2002 | Vesamaki et al. ........... | 361/816 |
| 6,392,900 | B1 | 5/2002 | Petty et al. | |
| 6,552,261 | B2 * | 4/2003 | Shlahtichman et al. ..... | 174/384 |
| 6,560,105 | B1 | 5/2003 | Roy et al. | |
| 6,962,550 | B2 * | 11/2005 | Kadota ........................ | 477/15 |
| 6,966,866 | B2 * | 11/2005 | Ando et al. .................... | 477/4 |

FOREIGN PATENT DOCUMENTS

WO    WO 95/06370    3/1995

OTHER PUBLICATIONS

Great Britain Search Report dated Jan. 11, 2005 for corresponding British application GB0419860.2.

* cited by examiner

*Primary Examiner*—Hung V. Ngo
(74) *Attorney, Agent, or Firm*—Dinsmore & Shohl LLP

(57) ABSTRACT

A scheme is provided for reducing the degree to which EMI from high voltage components of a fuel cell system or a fuel cell powered vehicle is induced in low voltage components of the system or vehicle. In accordance with one embodiment of the present invention, the electrical components of the system's high voltage region and the electrical components of the system's low voltage region are positioned such that, absent EMI shielding structure between the high and low voltage components, a substantial amount of EMI from the high voltage components would be induced in the low voltage components. EMI shielding structure is configured to define a conductive enclosure about the high voltage region and the low voltage region and a conductive EMI barrier between the high voltage region and the low voltage region.

41 Claims, 4 Drawing Sheets

EMI PROTECTION AND FUEL CELL SYSTEMS EMPLOYING THE SAME

BACKGROUND OF THE INVENTION

The present invention relates to fuel cell systems and fuel cell powered vehicles. More particularly, the present invention relates to a scheme for addressing electromagnetic interference (EMI) between electrical components of a fuel cell system or a fuel cell powered vehicle.

BRIEF SUMMARY OF THE INVENTION

According to the present invention, a scheme is provided for reducing the degree to which EMI from high voltage components of a fuel cell system or a fuel cell powered vehicle is induced in low voltage components of the system or vehicle. In accordance with one embodiment of the present invention, a system is provided comprising an electrochemical unit, at least one relatively low voltage electrical device, at least one relatively high voltage electrical device, control circuitry, and EMI shielding structure.

The electrochemical unit is configured to utilize first and second reactants to generate an electrical current. The relatively low and high voltage electrical devices are operatively coupled to the electrochemical unit. The control circuitry is operatively coupled to the relatively low voltage electrical device and the relatively high voltage electrical device and comprises a high voltage region and a low voltage region. The high voltage region comprises electrical components configured for operation at higher voltages than electrical components of the low voltage region. The electrical components of the high voltage region and the electrical components of the low voltage region are positioned such that, absent EMI shielding structure between the high and low voltage components, a substantial amount of EMI from the high voltage components would be induced in the low voltage components. The EMI shielding structure is configured to define a conductive enclosure about the high voltage region and the low voltage region and a conductive EMI barrier between the high voltage region and the low voltage region.

In accordance with another embodiment of the present invention, a vehicle is provided comprising an electrochemical unit, at least one relatively low voltage sensor, at least one relatively high voltage electrical device, control circuitry, and EMI shielding structure. The electrochemical unit is configured to utilize a first reactant from a hydrogenous fuel source and a second reactant in the form of an oxidizing reactant to generate an electrical current. The electrochemical unit is further configured to function as a source of motive power for the vehicle. The relatively high voltage electrical device and the relatively low voltage sensor are operatively coupled to the electrochemical unit.

The control circuitry is operatively coupled to the relatively low voltage electrical sensor so as to input a relatively low voltage signal from the sensor. The circuitry is also operatively coupled to the relatively high voltage electrical device so as to output a relatively high voltage control signal to the device. The control circuitry comprises a high voltage region including circuitry for generating the high voltage control signal and a low voltage region including circuitry for processing the low voltage sensor signal. The high voltage region and the low voltage region of the control circuitry are defined on a common printed circuit board and electrical components of the high and low voltage regions are positioned on the printed circuit board such that, absent EMI shielding structure between the high and low voltage components, a substantial amount of EMI from the high voltage components would be induced in the low voltage region. The EMI shielding structure is configured to define a conductive enclosure about the high voltage region and the low voltage region and a conductive EMI barrier between the high voltage region and the low voltage region.

Accordingly, it is an object of the present invention to provide a means by which EMI from high voltage components of a fuel cell system or a fuel cell powered vehicle is reduced. Other objects of the present invention will be apparent in light of the description of the invention embodied herein.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
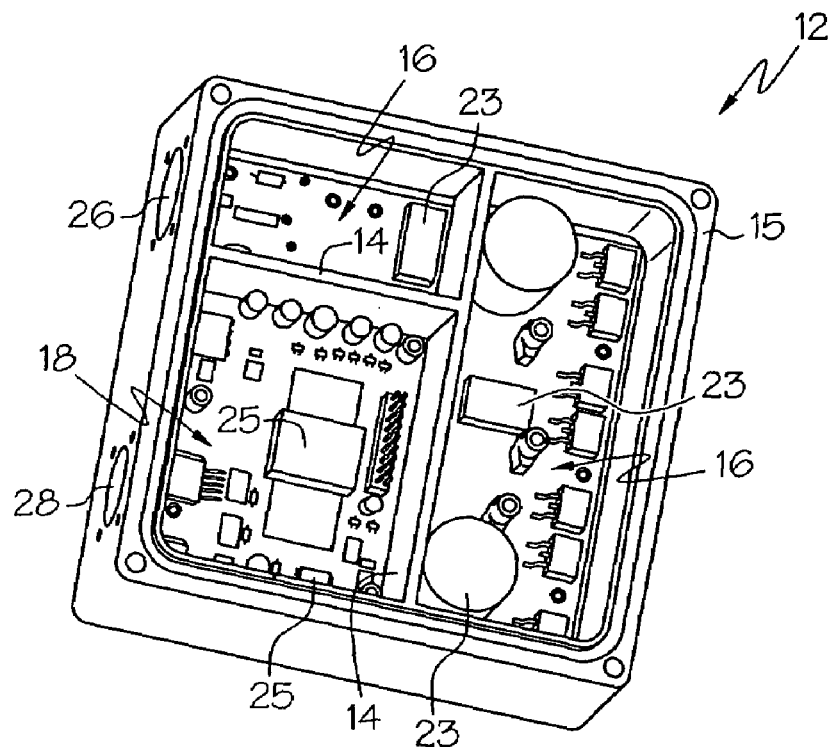
FIG. 1 is an illustration of control circuitry and EMI shielding structure according to the present invention.
Figure 2:
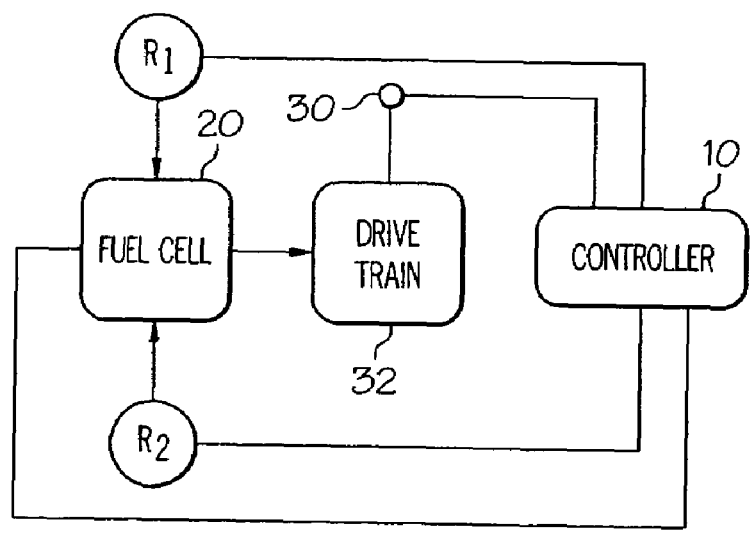
FIG. 2 is a schematic illustration of a fuel cell system including high and low voltage devices and a controller according to the present invention.

Referring initially to FIGS. 1 and 2, a shielded controller 10 and a system incorporating a shielded controller 10 according to the present invention are illustrated. Various components of the shielded controller 10 are illustrated in detail in FIG. 1. In contrast, FIG. 2 merely presents a schematic illustration of a system where the controller 10 is in communication with a variety of devices. The devices illustrated in FIG. 2 are presented by way of illustration, not by way of limitation, and include high and low voltage devices and an electrochemical unit in the form of a fuel cell 20 configured to utilize first and second reactants, e.g., a hydrogenous fuel source and an oxidant such as air, to generate an electrical current.

The present invention bears particular relevance to systems comprising relatively high and relatively low voltage devices. Accordingly, high voltage devices in the form of first and second reactant sources $R_1$, $R_2$ and a low voltage device in the form of a sensor 30 are illustrated in FIG. 2. It is important to note, however, that the broadest aspects of the present invention are not limited to any particular types of high and low voltage devices. Rather, the first and second reactant sources $R_1$, $R_2$ and the sensor 30 have merely been illustrated in FIG. 2 because they are employed in fuel cell systems. As will be appreciated by those skilled in the art of fuel cell systems, reactant sources and sensors utilized in a fuel cell system may take any of a variety of suitable forms, including devices that may be characterized as high voltage, low voltage, or no voltage. For example, a reactant source may comprise a relatively high voltage, motor driven compressor or a non-electronic pressurized gas reservoir.

For the purposes of defining and describing the present invention, it is noted that reference herein to relatively high and relatively low voltages does not imply specific operating voltage values to either type of device. Rather, the operating voltages of the two different types of devices are limited only in the sense that the operating voltage of a high voltage device is higher than the operating voltage of a low voltage device, and vice-verse. By way of illustration and not limitation, high voltage devices according to the present invention may comprise motors, compressors, heating element, cooling system components, DC/DC converters, fan modules, or any other device operating at a relatively high voltage. Low voltage devices may comprise sensors configured, for example, to detect a drive train condition of a vehicle, an operating condition of a vehicle, or an operating condition of a fuel cell system, or any other device operating at a relatively low voltage.

In the illustrated example, the low voltage sensor 30 is placed in communication with the controller 10 and is configured to detect the rotational speed or some other operational condition of a vehicle drive train 32. Similarly, the controller 10 is placed in communication with the first and second reactant sources $R_1$, $R_2$ and the fuel cell 20. As will be appreciated by those familiar with fuel cell systems and vehicles employing fuel cells as a source of motive power, the schematic illustration of FIG. 2 is greatly simplified and excludes many components of such systems. Nevertheless, FIG. 2 illustrates the general configuration of the controller and selected components of the system.

Turning to FIG. 1, the control circuitry of the controller 10 comprises high voltage regions 22 and a low voltage region 24. Simply put, the high voltage region 22 comprises electrical components configured for operation at higher voltages than the electrical components of the low voltage region 24. As is illustrated in FIG. 1, the electrical components of the high voltage region 22 and the electrical components of the low voltage region 24 are positioned directly adjacent to each other. Absent the EMI shielding structure, described in detail below, a substantial amount of EMI from the high voltage components of the high voltage region 22 would be induced in the low voltage components of the low voltage region 24.

An EMI shielding structure defines a conductive enclosure 12 about the high voltage region 22 and the low voltage region 24 and a conductive EMI barrier 14 between the high voltage region 22 and the low voltage region 24. The conductive enclosure defined by the EMI shielding structure may surround substantially all of the control circuitry and comprises a high voltage connector inlet 26 and a low voltage connector inlet 28. The high and low voltage connector inlets 26, 28 may be positioned to minimize EMI in low voltage connectors passing through the low voltage connector inlet 28 from high voltage connectors passing through the high voltage connector inlet 26 by, for example, positioning the inlets 26, 28 on opposite extremes of one of the sides of the enclosure 12.

The shielding structure is configured such that the printed circuit board, or boards, on which the high and low voltage regions 22, 24 of the control circuitry are arranged may be secured to the shielding structure. The shielding structure defines high voltage compartments 16 and a low voltage compartment 18 separated by the conductive EMI barrier 14. Although FIG. 1 illustrates a pair of high voltage compartments 16 and a single low voltage compartment, it is noted that any number of either types of compartments may be provided without departing from the scope of the present invention.

More specifically, the conductive enclosure 12 defined by the shielding structure defines an exterior wall structure 15 and an interior wall structure formed by the conductive EMI barrier 14. In the illustrated embodiment, the interior wall structure formed by the conductive EMI barrier 14 is configured to enhance the structural integrity of the enclosure.

Figure 3:
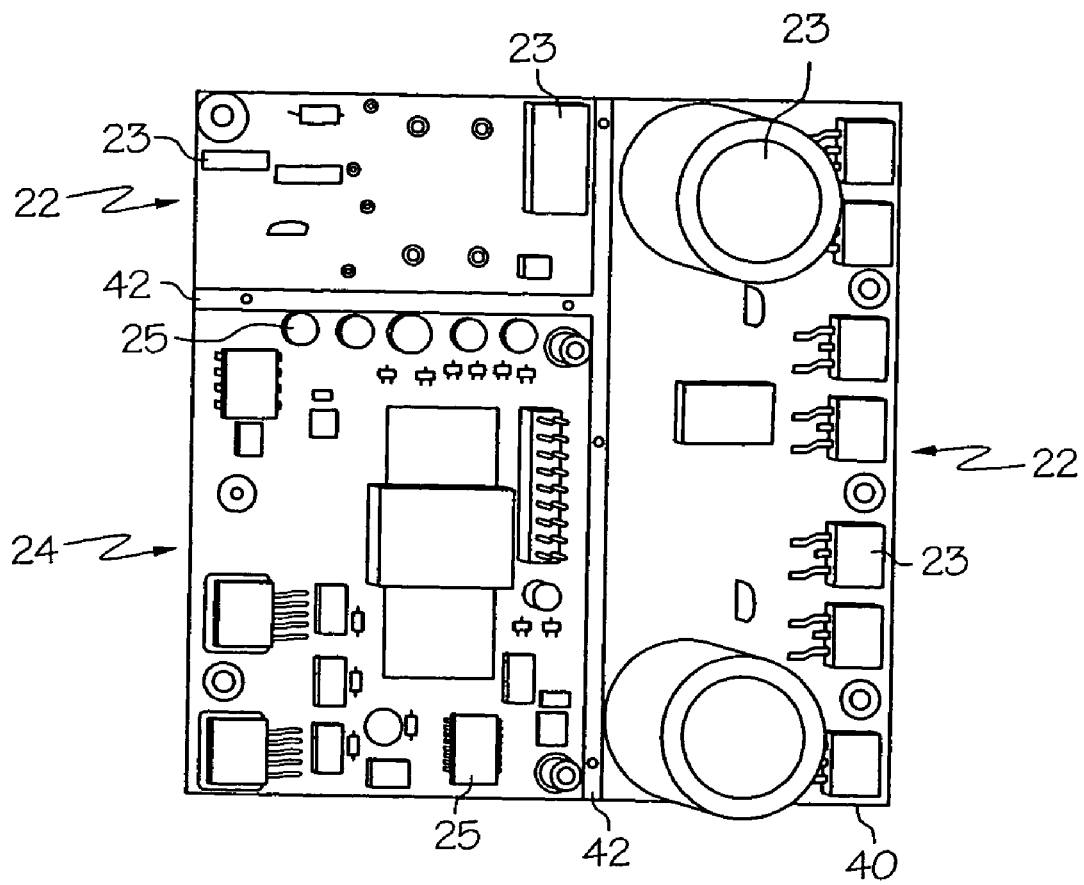
FIG. 3 is an illustration of control circuitry according to the present invention.

Referring to FIG. 3, the high voltage region 22 and the low voltage region 24 of the control circuitry may be defined on a common printed circuit board 40. Alternatively, it is contemplated that the high and low voltage regions may be defined on separate printed circuit boards. To improve EMI shielding, the conductive enclosure 12 defined by the shielding structure includes components that are aligned with conductive traces 42 formed on the printed circuit board 40. For example, by way of illustration and not limitation, in the illustrated embodiment, the conductive EMI barrier 14 and portions of the exterior wall structure 15 are aligned with the conductive traces 42.

The electrical components 23 of the high voltage region 22 are configured for operation at voltages that are significantly higher, i.e., at least one order of magnitude, than the operational voltages of the electrical components 25 of the low voltage region 24. More specifically, and by way of illustration and not limitation, the operational voltages of the high voltage region may be above about 450 V while the operational voltages of the low voltage region may be below about 5 V. Similarly, the electrical components 23 of the high voltage region 22 may also be configured for operation at electrical currents that are significantly higher, i.e., at least one order of magnitude, than the operational currents of the electrical components 25 of the low voltage region 24. More specifically, operational currents of the electrical components 25 of the low voltage region 24 may be below 0.01 Ampere while the electrical components of the high voltage region may be configured for operation well above 0.01 Ampere, e.g., up to about 700 Ampere. As a result, the resulting electromagnetic influence of the high voltage, high current signals on the low voltage, low current signals is potentially significant.

Figure 4:
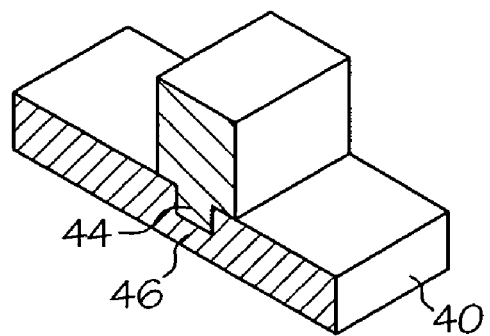
FIG. 4 is an illustration of male and female engaging surfaces of an EMI shielding interior wall structure and a printed circuit board according to the present invention.

Referring to FIG. 4, the interior wall structure 14 and the printed circuit board 40 upon which the high voltage region 22 and the low voltage region 24 of the control circuitry are arranged define complementary male and female engaging surfaces 44, 46. In this manner, secure attachment of the printed circuit board 40 to the interior wall structure 14 may be maintained in the face of thermal expansion and other mechanical stress. In one embodiment of the present invention, the complementary male and female engaging surfaces 44, 46 comprise a pin on the interior wall structure and a hole in the printed circuit board.

Regardless of the specific manner in which the interior and exterior wall structures 14, 15 are configured, it is noted that design considerations should take into account the significance of configuring the EMI shielding structure to prevent leakage from high voltage compartments into low voltage compartments. Design considerations may include optimization of the closeness of contact between the interior wall structure 14 and the printed circuit board 40 and the minimization of the size of any holes, gaps, or other openings in the interior and exterior wall structures 14, 15. Where holes or gaps cannot be eliminated, the size of such openings should be minimized and care should be taken to ensure that the size of the hole is small enough to account for the frequency and wavelength of the radiation to be shielded. Lines of sight through any necessary holes or gaps from one compartment to the next may be made indirect to improve shielding.

The exterior wall structure 15 and the interior wall structure 14 may also be placed in thermal communication with the printed circuit board 40 to sink heat generated in the control circuitry. To further this end, the structures may be formed of high thermal conductivity materials like aluminum or aluminum alloys. It is contemplated that abrasion and wear resistant coatings suitable for typical fuel cell environments may further be applied to such materials.

Figure 5:
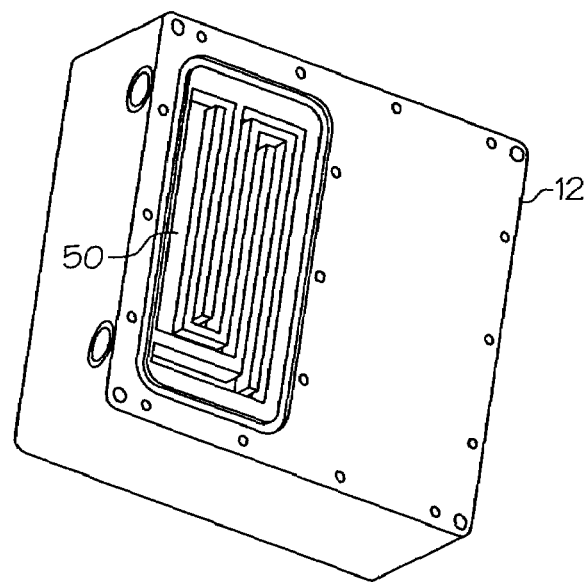
FIG. 5 is an illustration of an EMI shielding exterior wall structure comprising a coolant passage according to the present invention.
Figure 6:
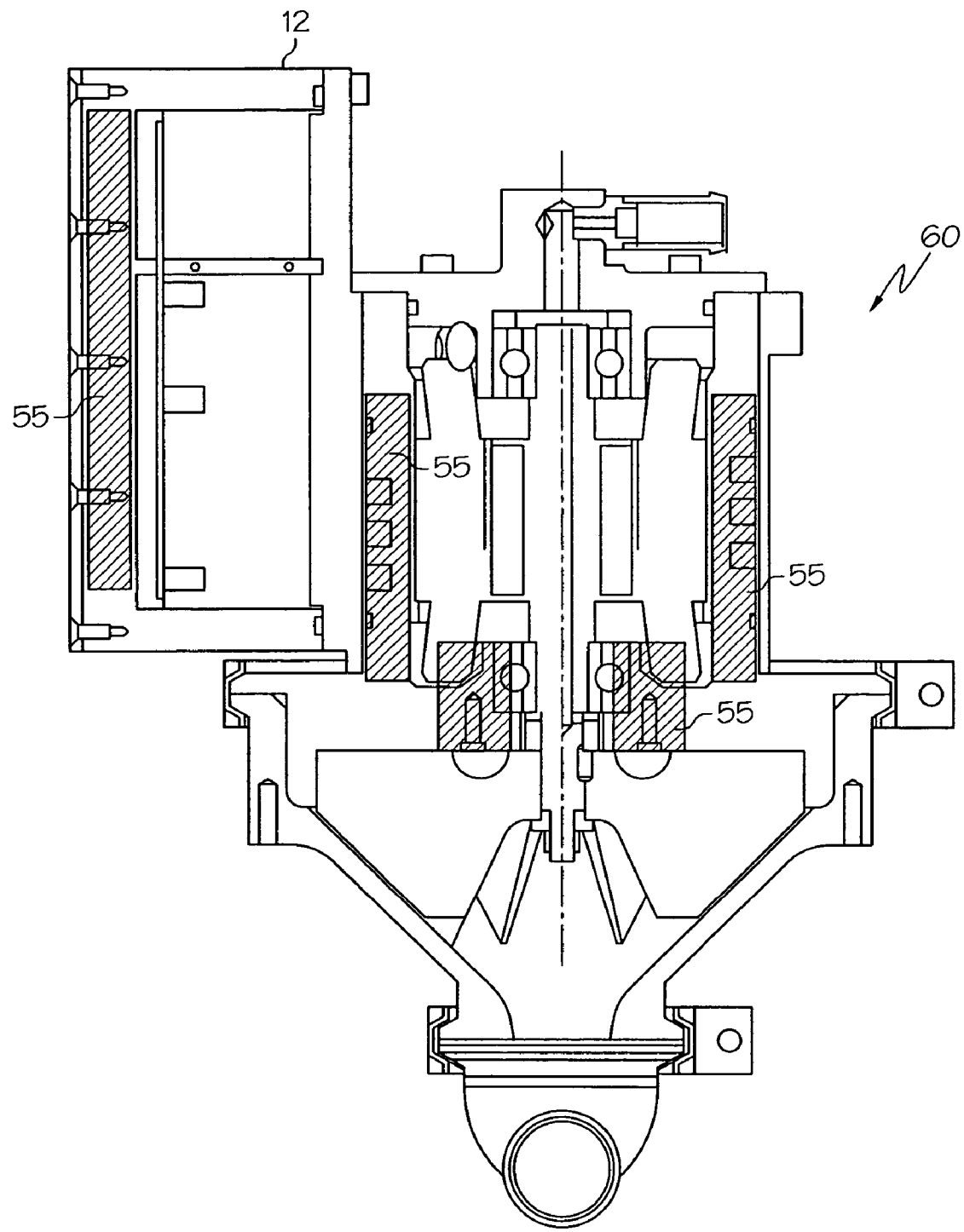
FIG. 6 is an illustration of a system including a high voltage electrical device coupled to EMI shielding structure according to the present invention.

One or more coolant passages 50 may be provided in the exterior wall structure 15, as is illustrated in FIG. 5. Alternatively, or additionally, the exterior wall structure is thermally coupled to one or more cooling elements 55, as is illustrated in FIG. 6. Of course, it is contemplated that coolant passages may be provided in any portion of the exterior or interior wall structures and cooling elements may be positioned in a variety of locations relative to the controller 10. In the context of a fluid-cooled motor vehicle, the coolant passages may be formed integrally with the existing coolant passages of the motor vehicle.

As is further illustrated in FIG. 6, where a compressor driven blower 60 is presented as one of the high voltage electrical devices of a fuel cell system, the conductive enclosure 12 defined by the shielding structure may be secured to the blower 60 or mechanically coupled to the blower 60 via suitable mounting hardware. Further, the conductive enclosure 12 of the controller 10 is oriented to minimize the distance between the high voltage connector inlet 26 and the blower 60. In this manner, the length of the high voltage electrical connections running from the controller 10 to the blower 60, and the corresponding EMI generated thereby, may be minimized. The shielding structure may be fabricated as a cast assembly or in any suitable manner.

Figure 7:
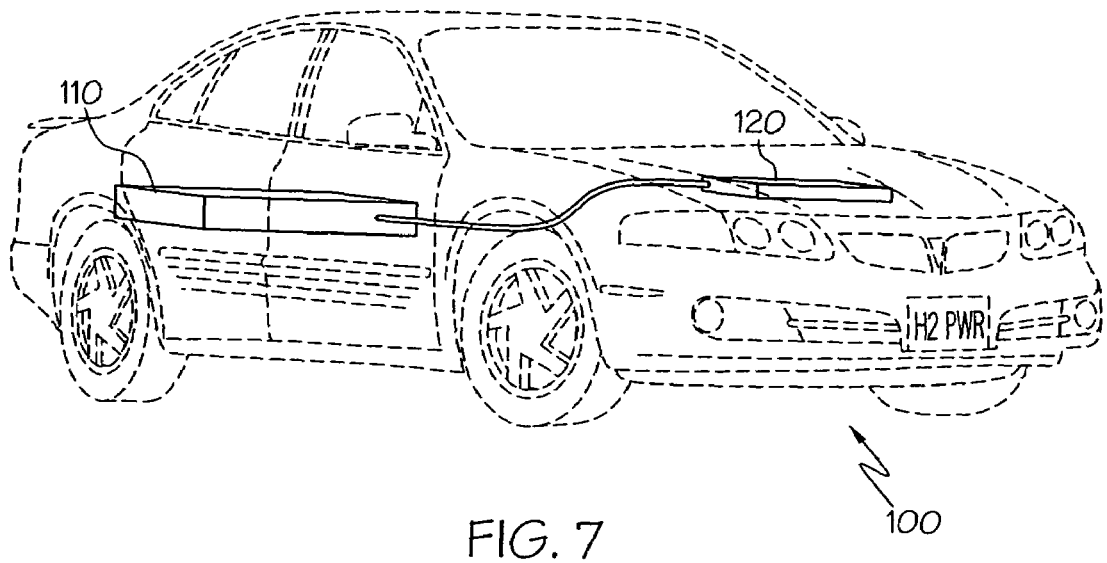
FIG. 7 is an illustration of a fuel cell powered vehicle according to the present invention.

Referring finally to FIG. 7, a vehicle 100 is illustrated comprising a hydrogenous fuel source 110 and a fuel cell system 120 including, among other things, an electrochemical unit, high and low voltage electrical devices, control circuitry, and EMI shielding structure according to the present invention.

For the purposes of defining and describing the present invention, it is noted that when reference is made to a device that is "operatively coupled" to another device, a number of operative relationships are contemplated, including, but not limited to, the following: (i) where a first device controls or provides a signal used to control a second device, or vice-versa (e.g., first device is a fuel cell voltage or current sensor, second device is the fuel cell); (ii) where the first device senses an operating condition of the second device, or vice-versa (e.g., first device is a fuel cell temperature sensor, second device is the fuel cell); (iii) where the first device controls or senses an operating condition of a third device, which is in turn operatively coupled to the second device (e.g., (a) first device is a drive train sensor, second device is a fuel cell, third device is a drive train powered by the fuel cell; (b) first device is a fuel cell temperature sensor, second device is the fuel cell, third device is a cooling fluid pump for the fuel cell; (c) first device is a drive train sensor, second device is a fuel cell, third device is a compressor or blower for directing a reactant to the fuel cell; etc.); and (iv) where the first device comprises electrical circuitry for processing signals input from or output to the second device (e.g., the first device comprises control circuitry and the second device comprises a sensor or a high voltage device in communication with the control circuitry).

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A system comprising:
   an electrochemical unit configured to utilize first and second reactants to generate an electrical current;
   at least one relatively low voltage electrical device operatively coupled to said electrochemical unit;
   at least one relatively high voltage electrical device operatively coupled to said electrochemical unit;
   control circuitry operatively coupled to said relatively low voltage electrical device and said relatively high voltage electrical device, wherein
      said control circuitry comprises a high voltage region and a low voltage region,
      said high voltage region comprises electrical components configured for operation at higher voltages than electrical components of said low voltage region, and
      electrical components of said high voltage region and electrical components of said low voltage region are positioned such that, absent EMI shielding structure between said high and low voltage components, a substantial amount of EMI from said high voltage components would be induced in said low voltage components; and
   an EMI shielding structure configured to define a conductive enclosure about said high voltage region and said low voltage region and a conductive EMI barrier between said high voltage region and said low voltage region.

2. A system as claimed in claim 1 wherein said conductive enclosure defined by said EMI shielding structure surrounds substantially all of said control circuitry.

3. A system as claimed in claim 1 wherein said conductive enclosure defined by said EMI shielding structure comprises at least one connector inlet.

4. A system as claimed in claim 3 wherein said conductive enclosure comprises a high voltage connector inlet and a low voltage connector inlet.

5. A system as claimed in claim 4 wherein said high and low voltage connector inlets are positioned to minimize EMI in low voltage connectors passing through said low voltage connector inlet from high voltage connectors passing through said high voltage connector inlet.

6. A system as claimed in claim 4 wherein said conductive enclosure is mechanically coupled to said high voltage electrical device and is oriented to minimize a distance between said high voltage connector inlet and said high voltage electrical device.

7. A system as claimed in claim 1 wherein said shielding structure is configured such that at least one printed circuit board comprising said high and low voltage regions of said control circuitry may be secured to said shielding structure.

8. A system as claimed in claim 1 wherein said shielding structure defines a high voltage compartment and a low voltage compartment separated by said conductive EMI barrier between said high voltage region and said low voltage region.

9. A system as claimed in claim 8 wherein said shielding structure defines a plurality of high voltage compartments, a plurality of low voltage compartments, or combinations thereof.

10. A system as claimed in claim 1 wherein:
said conductive enclosure defined by said shielding structure defines an exterior wall structure; and
said conductive EMI barrier forms an interior wall structure of said conductive enclosure.

11. A system as claimed in claim 10 wherein said interior wall structure formed by said conductive EMI barrier is configured to enhance structural integrity of said enclosure.

12. A system as claimed in claim 10 wherein said interior wall structure and a printed circuit board upon which said control circuitry is arranged define complementary male and female engaging surfaces.

13. A system as claimed in claim 12 wherein said complementary male and female engaging surfaces comprise a pin on said interior wall structure and a hole in said printed circuit board.

14. A system as claimed in claim 10 wherein said exterior wall structure and said interior wall structure are configured to sink heat generated in said control circuitry.

15. A system as claimed in claim 14 wherein said exterior wall structure comprises a coolant passage.

16. A system as claimed in claim 14 wherein said exterior wall structure is thermally coupled to a cooling element.

17. A system as claimed in claim 1 wherein said shielding structure is secured to said relatively high voltage electrical device.

18. A system as claimed in claim 17 wherein said shielding structure is secured to said relatively high voltage electrical device via mounting hardware.

19. A system as claimed in claim 17 wherein said shielding structure is secured directly to said relatively high voltage electrical device.

20. A system as claimed in claim 1 wherein said shielding structure comprises a significant amount of aluminum.

21. A system as claimed in claim 1 wherein said control circuitry is operatively coupled to a single high voltage electrical device.

22. A system as claimed in claim 1 wherein said control circuitry is operatively coupled to a plurality of high voltage electrical devices.

23. A system as claimed in claim 1 wherein said high voltage region and said low voltage region of said control circuitry are defined on a common printed circuit board.

24. A system as claimed in claim 1 wherein said high voltage region and said low voltage region of said control circuitry are defined on at least one printed circuit board.

25. A system as claimed in claim 24 wherein:
said printed circuit board comprises at least one conductive trace; and
said shielding structure includes components aligned with said conductive trace.

26. A system as claimed in claim 25 wherein said conductive EMI barrier is aligned with said conductive trace.

27. A system as claimed in claim 25 wherein:
said shielding structure defines an exterior wall structure and an interior wall structure; and
at least a portion of said exterior wall structure and said interior wall structure is aligned with said conductive trace.

28. A system as claimed in claim 1 wherein said electrical components of said high voltage region are configured for operation at electrical currents that are at least one order of magnitude greater than operational currents of said electrical components of said low voltage region.

29. A system as claimed in claim 1 wherein said electrical components of said high voltage region are configured for operation at voltages that are at least one order of magnitude greater than said operational voltages of said electrical components of said low voltage region.

30. A system as claimed in claim 29 wherein said electrical components of said high voltage region are configured for operation at amperometric currents of above about 10 Ampere.

31. A system as claimed in claim 30 wherein said electrical components of said high voltage region are configured for operation at amperometric currents of up to about 700 Ampere.

32. A system as claimed in claim 29 wherein said operational voltages of said high voltage region are above about 450 V and said operational voltages of said low voltage region are below about 5 V.

33. A system as claimed in claim 1 wherein said high voltage device is selected from a motor, a compressor, a heating element, a cooling system, a DC/DC converter, a fan module, and combinations thereof.

34. A system as claimed in claim 1 wherein said high voltage device comprises a blower configured to supply a reactant to said electrochemical unit.

35. A system as claimed in claim 1 wherein said low voltage device comprises a sensor.

36. A system as claimed in claim 35 wherein said sensor is configured to detect a drive train condition of a vehicle.

37. A system as claimed in claim 35 wherein said sensor is configured to detect an operating condition of said system.

38. A system as claimed in claim 35 wherein said sensor is configured to detect an operating condition of a motor vehicle.

39. A system as claimed in claim 1 wherein said first reactant comprises a hydrogenous fuel source and said second reactant comprises an oxidant.

40. A vehicle comprising:
an electrochemical unit configured to utilize a first reactant from a hydrogenous fuel source and a second reactant in the form of an oxidizing reactant to generate an electrical current, wherein said electrochemical unit is further configured to function as a source of motive power for said vehicle;
at least one relatively high voltage electrical device operatively coupled to said electrochemical unit;

a relatively low voltage sensor operatively coupled to said electrochemical unit;

control circuitry operatively coupled to said relatively low voltage electrical sensor so as to input a relatively low voltage signal from said sensor and operatively coupled to said relatively high voltage electrical device so as to output a relatively high voltage control signal to said device, wherein said control circuitry comprises a high voltage region including circuitry for generating said high voltage control signal and a low voltage region including circuitry for processing said low voltage sensor signal, said high voltage region and said low voltage region of said control circuitry are defined on a common printed circuit board, and electrical components of said high voltage region and electrical components of said low voltage region are positioned on said printed circuit board such that, absent EMI shielding structure between said high and low voltage components, a substantial amount of EMI from said high voltage components would be induced in said low voltage region; and an EMI shielding structure configured to define a conductive enclosure about said high voltage region and said low voltage region and a conductive EMI barrier between said high voltage region and said low voltage region, wherein said conductive enclosure defined by said EMI shielding structure comprises a high voltage connector inlet and a low voltage connector inlet, said high voltage connector inlet and said low voltage connector inlet are positioned to minimize EMI in low voltage connectors passing through said low voltage connector inlet from high voltage connectors passing through said high voltage connector inlet, said conductive enclosure is mechanically coupled to said high voltage electrical device and is oriented to minimize a distance between said high voltage connector inlet and said high voltage electrical device, said conductive enclosure is configured to sink heat generated in said control circuitry, and said shielding structure defines a high voltage compartment and a low voltage compartment separated by said conductive EMI barrier between said high voltage region and said low voltage region.

41. A vehicle comprising:

an electrochemical unit configured to utilize a first reactant from a hydrogenous fuel source and second reactant in the form of an oxidizing reactant to generate an electrical current, wherein said electrochemical unit is further configured to function as a source of motive power for said vehicle;

at least one relatively high voltage electrical device comprising a blower configured to supply a reactant to said electrochemical unit;

a relatively low voltage sensor configured to detect a drive train condition of said vehicle;

control circuitry operatively coupled to said relatively low voltage electrical sensor so as to input a relatively low voltage signal from said sensor and operatively coupled to said relatively high voltage electrical device so as to output a relatively high voltage control signal to said device, wherein said control circuitry comprises a high voltage region including circuitry for generating said high voltage control signal and a low voltage region including circuitry for processing said low voltage sensor signal, said high voltage region and said low voltage region of said control circuitry are defined on a common printed circuit board comprising at least one conductive trace, electrical components of said high voltage region are configured for operation at electrical currents that are at least one order of magnitude greater than operational currents of electrical components of said low voltage region, said electrical components of said high voltage region are configured for operation at voltages that are at least one order of magnitude greater than said operational voltages of said electrical components of said low voltage region, and said electrical components of said high voltage region and said electrical components of said low voltage region are positioned on said printed circuit board such that, absent EMI shielding structure between said high and low voltage components, a substantial amount of EMI from said high voltage components would be induced in said low voltage region; and an EMI shielding structure configured to define a conductive enclosure about said high voltage region and said low voltage region and a conductive EMI barrier between said high voltage region and said low voltage region, wherein said conductive EMI barrier is aligned with said conductive trace, said conductive enclosure defined by said EMI shielding structure comprises a high voltage connector inlet and a low voltage connector inlet, said high voltage connector inlet and said low voltage connector inlet are positioned to minimize EMI in low voltage connectors passing through said low voltage connector inlet from high voltage connectors passing through said high-voltage connector inlet, said conductive enclosure is mechanically coupled to said high voltage electrical device and is oriented to minimize a distance between said high voltage connector inlet and said high voltage electrical device, said conductive enclosure is configured to sink heat generated in said control circuitry, and said shielding structure defines a high voltage compartment and a low voltage compartment separated by said conductive EMI barrier between said high voltage region and said low voltage region.

* * * * *

UNITED STATES PATENT AND TRADEMARK OFFICE
CERTIFICATE OF CORRECTION

| | | |
|---|---|---|
| PATENT NO. | : 7,176,385 B2 | |
| APPLICATION NO. | : 10/702087 | |
| DATED | : February 13, 2007 | |
| INVENTOR(S) | : Hobmeyr et al. | |

It is certified that error appears in the above-identified patent and that said Letters Patent is hereby corrected as shown below:

On The Title Page; Item
(73) Assignee: "General Motors Corporation, Detroit, MI (US)" should read --General Motors Corporation, Detroit, MI (US), UQM Technologies, Inc., Frederick, Colorado (US), and Barber-Nichols, Inc., Arvada, Colorado (US) --; and Col. 10, line 47 "high-voltage" should read --high voltage--.

Signed and Sealed this

Twenty-first Day of August, 2007

JON W. DUDAS
*Director of the United States Patent and Trademark Office*